United States Patent
Denoyer et al.

(10) Patent No.: US 7,030,702 B2
(45) Date of Patent: Apr. 18, 2006

(54) OPTICAL RECEIVER WITH WIDE DYNAMIC RANGE TRANSIMPEDANCE AMPLIFIER

(75) Inventors: Gilles P. Denoyer, San Jose, CA (US); Dan Case, Gilroy, CA (US)

(73) Assignee: Finisar Corporation, Sunnyvale, CA (US)

( * ) Notice: Subject to any disclaimer, the term of this patent is extended or adjusted under 35 U.S.C. 154(b) by 129 days.

(21) Appl. No.: 10/838,019

(22) Filed: May 3, 2004

(65) Prior Publication Data

US 2004/0207472 A1 Oct. 21, 2004

Related U.S. Application Data

(63) Continuation of application No. 10/371,847, filed on Feb. 21, 2003, now Pat. No. 6,771,132.
(60) Provisional application No. 60/429,129, filed on Nov. 26, 2002.

(51) Int. Cl.
*H03F 3/08* (2006.01)
*H03F 1/36* (2006.01)
*H01J 40/14* (2006.01)

(52) U.S. Cl. .................. 330/308; 330/110; 250/214 A
(58) Field of Classification Search .............. 330/308, 330/110; 250/214 A
See application file for complete search history.

(56) References Cited

U.S. PATENT DOCUMENTS

| | | | |
|---|---|---|---|
| 5,012,202 A | | 4/1991 | Taylor |
| 5,606,277 A | * | 2/1997 | Feliz ........................ 327/311 |
| 5,646,573 A | | 7/1997 | Bayruns et al. |
| 6,069,534 A | * | 5/2000 | Kobayashi .................. 330/308 |
| 6,141,169 A | * | 10/2000 | Pietruszynski et al. ....... 360/67 |
| 6,239,659 B1 | | 5/2001 | Grässle |
| 6,297,701 B1 | | 10/2001 | Visocchi et al. |
| 6,359,517 B1 | * | 3/2002 | Colaco ....................... 330/308 |
| 6,404,281 B1 | | 6/2002 | Kobayashi |

OTHER PUBLICATIONS

Design on Integrated Circuits for Optical Communications, Behzad Razavi, McGraw Hill, ISBN 0-07-122972-8.

* cited by examiner

*Primary Examiner*—Patricia Nguyen
(74) *Attorney, Agent, or Firm*—Workman Nydegger

(57) ABSTRACT

An optical component, such as an optical receiver, is provided that includes a detector configured to receive a signal from an optical fiber and to communicate with a translationl module of the optical component. A transimpedance amplifier of the optical component is configured to receive an electrical signal from the detector and to transmit an amplified signal to the translation module. The transimpedance amplifier is configured for a controlled low cutoff frequency as optical power to the transimpedance amplifier increases, so that the optical sensitivity of the transimpedance amplifier is not traded for optical overload.

33 Claims, 4 Drawing Sheets

OPTICAL RECEIVER WITH WIDE DYNAMIC RANGE TRANSIMPEDANCE AMPLIFIER

RELATED APPLICATIONS

This application is a continuation, and claims the benefit, of U.S. patent application Ser. No. 10/371,847, entitled A WIDE DYNAMIC RANGE TRANSIMPEDANCE AMPLIFIER WITH A CONTROLLED LOW FREQUENCY CUTOFF AT HIGH OPTICAL POWER, filed Feb. 21, 2003 now U.S. Pat. No. 6,771,132, which, in turn, claims the benefit of U.S. Provisional Application No. 60/429,129, entitled CIRCUIT FOR WIDE DYNAMIC RANGE TRANSIMPEDANCE AMPLIFIER, and filed Nov. 26, 2002. Both of the aforementioned applications are incorporated herein in their respective entireties by this reference.

BACKGROUND OF THE INVENTION

1. The Field of the Invention

The present invention relates generally to optical components. More particularly, embodiments of the invention are concerned with optical components, such as an optical receiver, that include a wide dynamic range transimpedance amplifier.

2. Related Technology

Fiber optic networks use light signals to transmit data over a network. Although light signals are used to carry data, the light signals are typically converted into electrical signals in order to extract and use the data. The conversion of an optical signal into an electrical signal is often achieved utilizing a fiber optic receiver. A fiber optic receiver converts the optical signal received over the optical fiber into an electrical signal, amplifies the electrical signal, and converts the electrical signal into an electrical digital data stream.

The fiber optic receiver usually includes a photodiode that detects the light signal and converts the light signal into an electrical signal or current. A transimpedance amplifier amplifies the signal from the photodiode into a relatively large amplitude electrical signal. The amplified electrical signal is then converted into a digital data stream.

The optical signals that are converted into electrical signals by the fiber optic receiver, however, can vary significantly in both amplitude and power. The power of the optical signal is often related, for example, to the length of the optical fiber over which the optical signal was received, the laser source, etc. These and other factors result in optical signals whose incident power at the transimpedance amplifier can vary significantly.

Fiber optic receivers are only able to successfully receive and amplify optical signals that fall within a particular power range. In order for a fiber optic receiver to accommodate a wide range of optical signals, the fiber optic receiver and in particular, the transimpedance amplifier, should be able to detect and amplify very low levels of optical power as well as high levels of optical power. The range of signals that can be successfully amplified is therefore effectively limited by the incident optical power because the fiber optic receiver distorts or clamps signals whose optical power is too large and cannot recognize signals whose optical power is too low.

One problem with current transimpedance amplifiers is that extending the ability of the transimpedance amplifier to amplify signals with more optical power usually diminishes the ability of the transimpedance amplifier to amplify signals with low optical power. In other words, the maximum optical input power that can be accepted by the transimpedance amplifier while meeting signal integrity and bit error rate specifications is usually specified as the input optical overload. The minimum input power is specified as optical sensitivity. The transimpedance amplifier should be designed to maximize the optical overload and minimize the optical sensitivity. In most of the commercial or published transimpedance amplifiers, there is a direct tradeoff between the circuit optical (or current) sensitivity (or equivalent input current noise) and the optical (or current) overload. Some solutions to this problem, such as utilizing clamping circuitry or voltage regulators to assist in the amplification of optical signals with relatively large optical power, add both cost and complexity to the transimpedance amplifier of the fiber optical receiver. Without the aid of additional circuitry, the range of signals that can be successfully amplified is somewhat limited because the circuitry used for automatic gain control and DC cancellation introduces unwanted gain into the transimpedance amplifiers at large optical power.

The unwanted gain also has an adverse effect on the low frequency cutoff at higher optical powers. In other words, transimpedance amplifiers do not function at certain frequencies because the low frequency cutoff has been increased. The low frequency cutoff for these types of transimpedance amplifiers is related to the transconductance of the circuitry used for automatic gain control and DC cancellation. Thus, as the current of the input signal increases, the low frequency cutoff of the transimpedance amplifier is adversely affected.

BRIEF SUMMARY OF AN EXEMPLARY EMBODIMENT OF THE INVENTION

These and other limitations are overcome by the present invention, which relates to a wide range dynamic transimpedance amplifier. In one exemplary embodiment of the present invention, an optical component, such as an optical receiver for example, is provided that includes a detector configured to receive a signal from an optical fiber and to communicate, at least indirectly, with a translation module of the optical component.

Additionally, the optical component includes a transimpedance amplifier having a controlled low cutoff frequency as optical power to the transimpedance amplifier increases. The transimpedance amplifier is configured to receive an electrical signal from the detector and to transmit an amplified signal to the translation module.

In this particular exemplary implementation, the transimpedance amplifier includes a forward transimpedance circuit configured to receive the input current from the detector, and the forward transimpedance circuit further is configured to generate an output signal and transmit the output signal to the translation module. More particularly, the transimpedance amplifier includes a feedback circuit having a first circuit configured to detect a low frequency component of the output signal. As well, the feedback circuit includes a second circuit configured to be driven by the low frequency component of the output signal and connected with the forward transimpedance circuit such that a transconductance of the second circuit is substantially unrelated to a low frequency cutoff of the transimpedance amplifier as the input current increases.

Among other things, this arrangement ensures that the optical sensitivity of the transimpedance amplifier is not traded for optical overload. These and other aspects of embodiments of the present invention will become more fully apparent from the following description and appended claims.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF EXEMPLARY EMBODIMENTS OF THE INVENTION

The present invention relates to a wide dynamic range transimpedance amplifier. The present invention more particularly relates to a wide dynamic range transimpedance amplifier with automatic gain control and direct current (DC) cancellation control. The automatic gain control and direct current cancellation control are achieved in one embodiment using variable impedance circuitry whose impedance is controlled by or related to the average photodiode current. The variable impedance circuitry does not introduce significant gain into the transimpedance amplifier. In addition to automatic gain control and direct current cancellation, the optical sensitivity of the transimpedance amplifier is not reduced while the optical overload is increased.

As the average photodiode current increases, the impedance of the variable impedance circuitry decreases. The variable impedance circuitry cancels the DC component of the input signal and attenuates the AC component of the input signal, thereby providing automatic gain control while canceling the DC component of the input signal.

Figure 1:
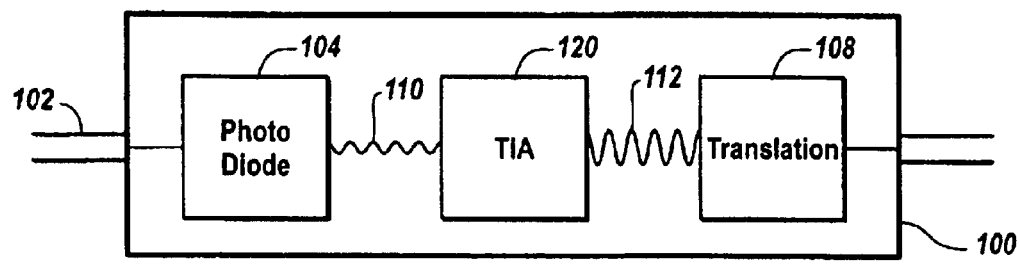
FIG. 1 illustrates an exemplary environment for implementing embodiments of the present invention.

FIG. 1 illustrates an exemplary environment for implementing embodiments of the present invention. FIG. 1 illustrates a fiber optic receiver 100 that receives an optical signal (usually represented as a current) and converts the optical signal to an electrical signal or data stream (usually represented as a voltage). The fiber optic receiver 100 receives an optical signal over an optical fiber 102. A photo diode 104 or other optical device that converts an optical signal to an electrical signal or current receives the optical signal and generates an electrical signal 110. The transimpedance amplifier 120 amplifies the electrical signal 110 to produce the amplified electrical signal 112. The transimpedance amplifier 120 has a wide dynamic range that is able to amplify signals with large power without significantly diminishing the ability to amplify signals with low power. The amplified electrical signal 112 is then translated by the translation module 108 and converted into an electrical digital signal 114.

Figure 2:
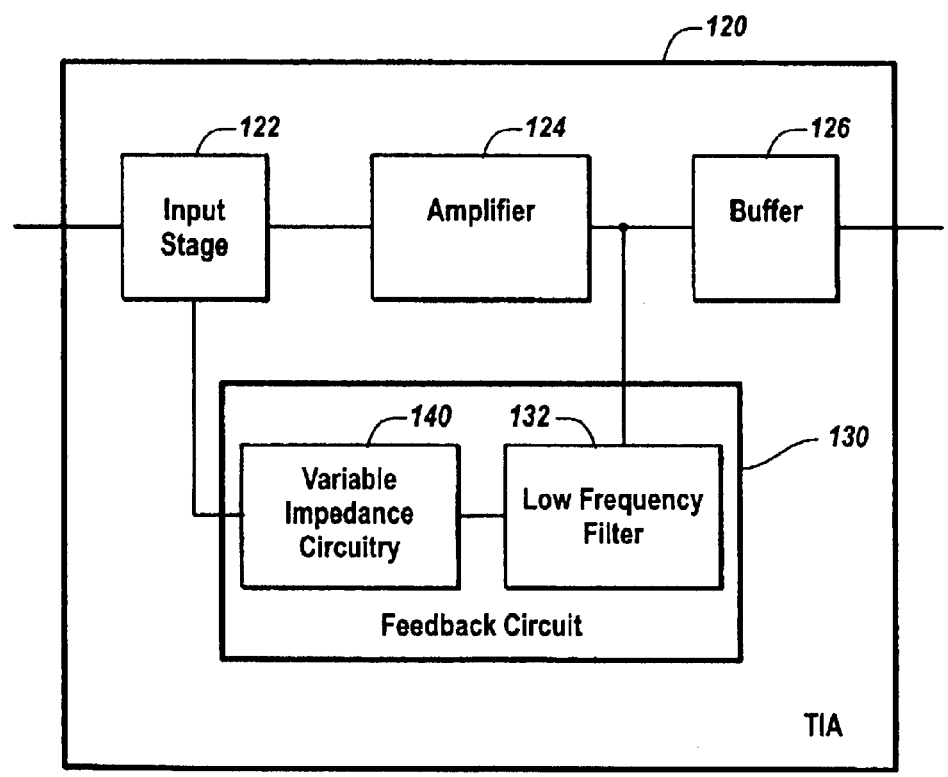
FIG. 2 is a block diagram of a transimpedance amplifier that provides both automatic gain control and DC cancellation.

FIG. 2 illustrates a block diagram of an exemplary transimpedance amplifier in accordance with the present invention. The transimpedance amplifier 120 includes an input stage 122 that receives an electrical signal 110 from a photo diode or other device that converts an optical signal into the electrical signal. An amplifier 124 amplifies the electrical signal and helps reduce or prevent noise from being a factor. A buffer 126 is also optionally provided at the output of the transimpedance amplifier 120. In one embodiment, the input stage 122 and the amplifier 124 are referred to as an forward transimpedance circuit. It is understood by one of skill in the art that the input stage 122 and the amplifier 124 can be implemented in different configurations. Exemplary configurations include, but are not limited to, a common base configuration and a shunt feedback configuration. In addition, the amplifier 124 includes single ended amplification, differential amplification, and the like or any combination thereof.

The feedback circuit 130 provides both automatic gain control and direct current (DC) cancellation for the transimpedance amplifier 120. In the feedback circuit 130, a low frequency filter 132 is used to detect the DC component output by the amplifier 124. The DC component or low frequency component of the output of the amplifier 124 is passed by the low frequency filter 132 and is canceled by the variable impedance circuitry 140. In another embodiment, the low frequency filter 132 may be replaced with a peak detector or similar circuitry.

The variable impedance circuitry 140 also provides automatic gain control for the transimpedance amplifier 120 because it is able to attenuate at least some of the AC content of the photodiode current when the impedance of the variable impedance circuitry 140 decreases. In other words, the impedance of the variable impedance circuitry 140 changes according to the average current of the photodiode. As the average current received from the photo diode or other source increases, the impedance of the variable impedance circuitry decreases. Because the impedance of the variable impedance circuitry 140 decreases, the variable impedance circuitry 140 absorbs or attenuates some of the AC component. This provides automatic control of the transimpedance gain of the fiber optic receiver. When the average photodiode current is low, the impedance of the variable impedance circuitry 140 relatively large and the AC component is not absorbed or attenuated, but is amplified at the input stage 122 and/or by the amplifier 124. Thus, the optical overload of the transimpedance amplifier is increased without simultaneously trading off the optical sensitivity of the transimpedance amplifier.

This is advantageous for the transimpedance amplifier 120 because the range of signals that can be amplified without clipping, saturation, or other problems, is increased. Low power signals are also amplified by the transimpedance amplifier 120 as the AC component is not absorbed or attenuated by the variable impedance circuitry 140, while optical signals with higher optical power are partially absorbed or attenuated by the variable impedance circuitry 140. The transimpedance amplifier 120 can thereby successfully amplify a wide range of signals.

Figure 3:
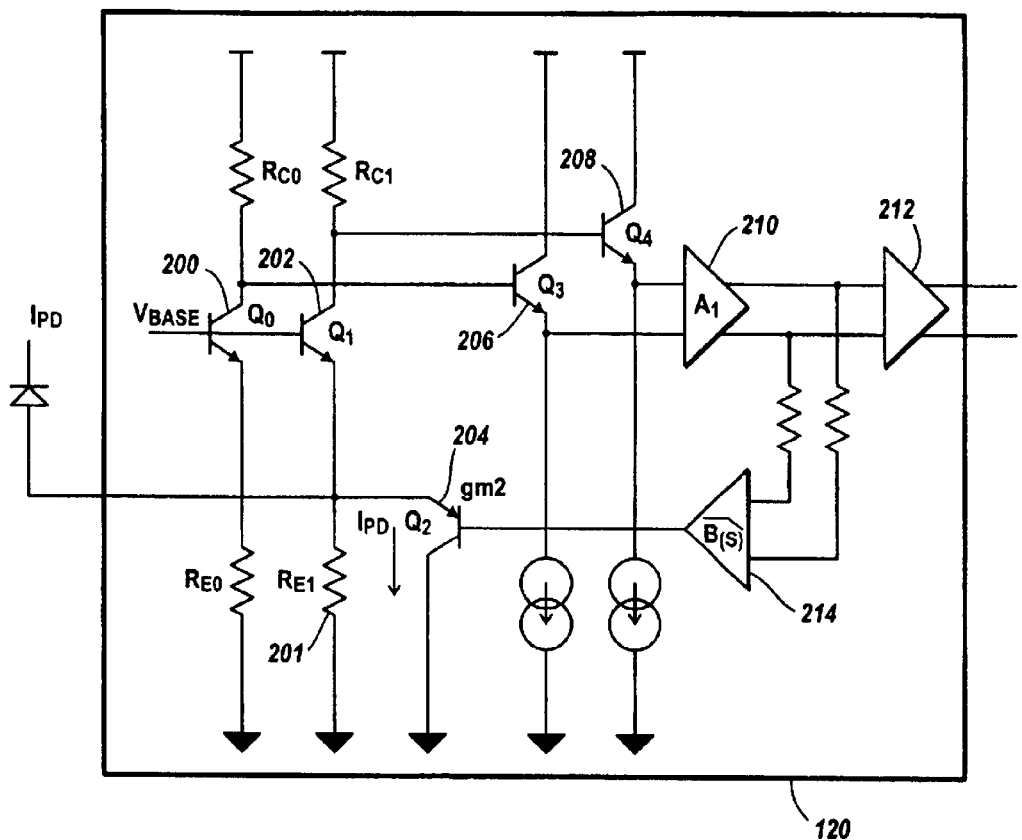
FIG. 3 illustrates one embodiment of the present invention in a common base configuration with a variable impedance formed using a pnp transistor.

FIG. 3 illustrates one embodiment of a transimpedance amplifier 120. The transimpedance amplifier 120 of FIG. 3 utilizes a common base topology with a feedback circuit that provides both low frequency or DC cancellation and automatic gain control, as previously stated. Generally, the transimpedance amplifier includes an amplifier that includes one or more stages. The DC offset or component is sensed by the feedback circuit and eliminated from the input signal. In the example of FIG. 3, the transistors 200 and 202 are included in the input stage. The current from the photodiode is converted to a voltage by the transistor 202. The voltage output by the transistor 200 serves as a reference voltage in this embodiment. An output signal from the transistors 200 and 202 is input to the transistors 206 and 208, which are arranged in an emitter follower configuration such that the voltage at the emitters substantially follows the voltage at the bases of the transistors 206 and 208. The amplifier 210 amplifies the output of the emitter followers (206 and 208).

The DC or low frequency component of the output of the amplifier 210 is passed by the low frequency operational amplifier 214, which is an example of a low frequency filter, and drives the base of the transistor 204. The low frequency operational amplifier 214 can be replaced with a peak detector or similar circuitry. Also, the DC or low frequency component can be sensed at the output of the input stage or at the output of the output of the emitter follower transistors 206 and 208.

In FIG. 3, the transistor 204 is a pnp transistor and the DC component or low frequency component detected by the low frequency operational amplifier 214 drives the base of the pnp transistor 204. The emitter of the pnp transistor 204 is also electrically connected with the signal generated by the photo diode. As the average photo diode current increases, the emitter impedance of the transistor 204 decreases. This enables some of the AC component being processed by the transistor 202 to be absorbed by the transistor 204 and permits the transimpedance amplifier to amplify or transmit signals whose optical power is large. The transistor 204 is an example of the variable impedance circuitry of FIG. 2.

Because the transimpedance amplifier shown FIG. 3 uses a pnp transistor instead of a npn transistor for the transistor 204 ($Q_2$), the AC content or component of the photodiode current will be absorbed or attenuated by the transistor 204 when the impedance seen at the emitter of the transistor 204 decreases. This is the case when the photodiode current increases and the optical signal detected by the photodiode has increased power.

However, the pnp transistor 204 can be replaced with an npn transistor as long as the input signal from the photodiode is not connected at the collector of the npn transistor. The input signal is connected with the emitter of the npn transistor. Also the cathode of the photodiode connector is connected with the emitter of the npn transistor in this embodiment.

The variation of the input impedance at the emitter of the transistor 204 with the average photodiode current provides an automatic control of the transimpedance gain of the receiver with the average photodiode current. In contrast, when an npn transistor is utilized instead of a pnp transistor in the embodiment of FIG. 3 and the collector of the npn transistor is connected with the photodiode, the AC component of the photodiode current is not attenuated because the impedance of the npn transistor is not dependent on the average photo diode current. In addition, an npn transistor introduces gain as the average photo diode current increases. The pnp transistor 204 does not introduce the gain that would otherwise be introduced by an npn transistor.

Figure 4:
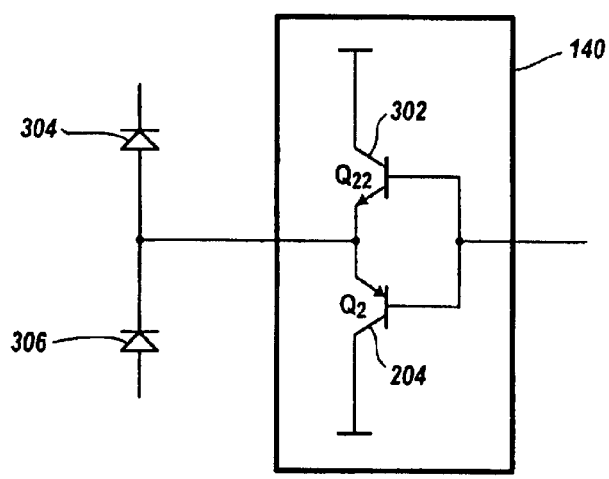
FIG. 4 illustrates an embodiment of feedback circuitry in a transimpedance amplifier where the variable impedance includes both an npn transistor and a pnp transistor, thereby enabling the variable impedance to either source or sink current from the photodiode.

FIG. 4 illustrates another example of the variable impedance circuitry 140. In this example, a npn transistor 302 is coupled with the pnp transistor 204. More specifically, the emitter of the transistor 302 is connected to the emitter of the transistor 204. This permits the variable impedance circuitry 140 to either source or sink the DC and AC components of current and the photodiode can therefore be connected to either a negative supply (or ground) or a positive supply. If the photodiode 306 is connected to a negative supply or ground, then the npn transistor 302 has a variable impedance that depends on the average current of the photodiode 306. When the photodiode 304 is utilized, then the pnp transistor 204 has a variable impedance that is used for automatic gain control through AC attenuation and DC cancellation.

With reference to FIGS. 2 and 3, the feedback circuit includes a very low gain-bandwidth op-amp (B(s)) driving the base of the transistor 204 and/or the transistor 302 ($Q_{22}$). The feedback circuit senses the DC offset at the output of the Al gain stage (210) or at the output of the transistors 206 and 208, or other suitable location. Because the gain stage of the amplifier 210 is DC coupled to the input stage of the transimpedance amplifier, any offset between the transistor 200 and transistor 202 collector voltages resulting from a difference of collector current is compensated by the transistor 302 sourcing current at the input of the transimpedance amplifier or the transistor 204 sinking current at the input of the transimpedance amplifier.

As a result, the feedback loop or circuit 130 from the amplifier or gain stage to the input of the transimpedance amplifier removes the DC current or low frequency component of the photodiode signal. Therefore, the transconductance $g_{m2}$ of the transistor 204 is proportional to the average photodiode current and hence the average received optical power (assuming the internal offset generated by the transimpedance amplifier is ignored).

For the transistor 302 ($Q_{22}$) or the transistor 204 ($Q_2$) the transconductance is:

$$g_{m2} = \frac{I_{PD}}{V_T}, \quad (1)$$

where $I_{PD}$ is the average current of the photodiode or other optical device that converts an optical signal in to an electrical signal such as current.

In the frequency range where the transimpedance amplifier junction capacitances and the photodiode input capacitance can be ignored, the closed loop transimpedance transfer function is given by:

$$\frac{V_{out}}{I_{in}} = \frac{\frac{g_{m1}}{g_{m1}+g_{m2}} R_C \cdot A_1}{1 + \frac{g_{m1}}{g_{m1}+g_{m2}} R_C \cdot A_1 \cdot g_{m2} \cdot B(s)} \text{ or} \quad (2)$$

$$\frac{V_{out}}{I_{in}} = \frac{A}{1+A\beta} \quad (3)$$

where the forward gain $$A = \frac{g_{m1}}{g_{m1} + g_{m2}} R_C \cdot A_1$$

and the feedback gain $\beta = g_{m2} \cdot B(s)$.

The transconductance of the common base input stage is $g_{m1}$ and is set by the base voltage and the resistor $R_E$ 201 in the emitter.

In this example, a low frequency dominant pole OP-AMP with a DC gain of B drives the base of the feedback transistors (pnp transistor 204 ($Q_2$) and/or the npn transistor 302 ($Q_{22}$)). The feedback gain can be written:

$$\beta = g_{m2} \frac{B}{1 + \frac{s}{w_0}} \quad (4)$$

The transconductance of the transistors 200 and 202 depend on the voltage $V_{BASE}$ and the resistor $R_E$ in series with their emitters. The bias of the input stage ($I_{C(Q1)}$ and $I_{C(Q0)}$) should be optimized for bandwidth and noise. The bias of the input stage does not depend on the average photodiode current and remains constant when the optical power received at the photodiode changes.

The transimpedance amplifier 120 is examined below from the perspectives of low optical power and of high optical power. At low optical power, $g_{m2} \ll g_{m1}$ (or $I_{PD} \ll I_{C(Q1)}$). Therefore, the transimpedance of the transimpedance amplifier transfer function can be simplified:

$$\frac{V_{out}}{I_{in}} = \frac{R_C \cdot A_1}{1 + R_C \cdot A_1 \cdot g_{m2} \cdot B(s)} \quad (5)$$

In the signal frequency band at low optical power, the transimpedance value of the transimpedance amplifier becomes:

$$\frac{V_{out}}{I_{in}} = R_C \cdot A_1 \quad (6)$$

At high optical power, where $g_{m1} \ll g_{m2}$ (or $I_{PD} \gg I_{C(Q1)}$)

$$\frac{V_{out}}{I_{in}} = \frac{\frac{g_{m1}}{g_{m2}} \cdot R_C \cdot A_1}{1 + \frac{g_{m1}}{g_{m2}} \cdot R_C \cdot A_1 \cdot g_{m2} \cdot B(s)} \quad (7)$$

In the signal frequency band at high optical power, the transimpedance value becomes:

$$\frac{V_{out}}{I_{in}} = \frac{g_{m1}}{g_{m2}} \cdot R_C \cdot A_1 \text{ or} \quad (8)$$

$$\frac{V_{out}}{I_{in}} = \frac{I_{C(Q1)}}{I_{PD}} \cdot R_C \cdot A_1 \quad (9)$$

The low frequency feedback causes the closed loop gain frequency response to have a low frequency cutoff given by:

$$f_{HPF-3dB} = \frac{g_{m1}}{(g_{m1} + g_{m2})} \cdot R_C \cdot A_1 \cdot g_{m2} \cdot B \cdot f_0 \quad (10)$$

where $$f_0 = \frac{w_0}{2\pi}$$

and B is the DC gain of the op-amp.

At low optical power, $g_{m2} \ll g_{m1}$ (or $I_{PD} \ll I_{C(Q1)}$). Thus, equation (10) can be simplified and the low frequency cutoff is given by:

$$f_{HPF-3dB} = R_C \cdot A_1 \cdot g_{m2} \cdot B \cdot f_0. \quad (11)$$

At high optical power, $g_{m1} \ll g_{m2}$ (or $I_{PD} \gg I_{C(Q1)}$) and equation (10) can be simplified and the low frequency cutoff is given by:

$$f_{HPF-3dB} = R_C \cdot A_1 \cdot g_{m1} \cdot B \cdot f_0. \quad (12)$$

The low cutoff frequency at high optical power is not dependent on the transistor 204 or on the transconductance of the transistor 204. The low cutoff frequency is controlled. The low cutoff frequency represents the −3 dB low corner frequency in the frequency response of the transimpedance amplifier. The present invention places a limit or controls the low corner frequency at high optical power.

In contrast, a similar analysis applied to a circuit that utilizes an npn transistor in place of the pnp transistor such that the collector of the npn transistor is connected with the input signal or current has a low frequency cutoff that is dependent on the transconductance of the npn transistor. As the average photodiode current increases, the npn transistor causes the transimpedance amplifier to have a higher low frequency cutoff. One disadvantage is that a transimpedance amplifier using an npn transistor in the place of the pnp transistor 204 is that the transimpedance amplifier does not function at lower frequencies for higher optical power or larger input currents. The present invention, however, functions at lower frequencies for higher optical power or larger input currents. This permits embodiments of the transimpedance amplifier to be integrated with existing networks that operate at lower frequencies.

Figure 5:
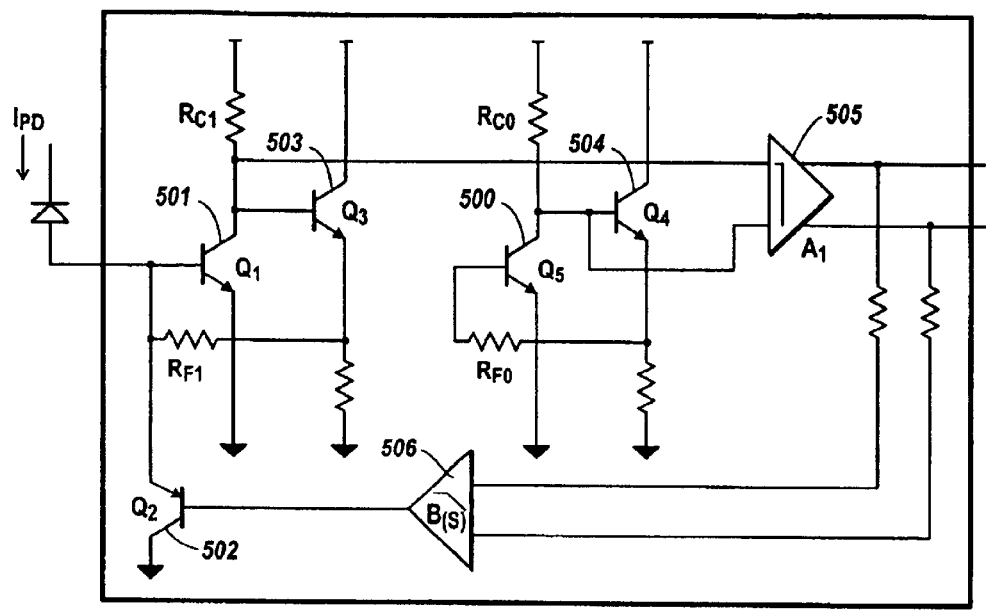
FIG. 5 depicts a shunt feedback transimpedance amplifier with automatic gain control and DC cancellation circuitry.

FIG. 5 is another embodiment of the automatic gain control low frequency feedback loop using a shunt feedback topology. The transistor 502 can be replaced with the circuit illustrated in FIG. 4 to accommodate both a negative and positive supply as previously discussed.

The same analysis can be made for the shunt-feedback transimpedance amplifier configurations that was made for the common base configuration of FIG. 3. Using nodal analysis on the small signal circuit low frequency model of the transimpedance amplifier input stage shunt-feedback amplifier in FIG. 5, the transimpedance transfer function of the transimpedance amplifier can be extracted. In the frequency range where the transimpedance amplifier junction capacitances and the photodiode input capacitance can be ignored, the closed loop transimpedance transfer function is given by:

$$\frac{V_{out}}{I_{in}} = -\frac{\frac{g_{m1} \cdot R_C \cdot A_1 \cdot R_F}{1 + g_{m1} \cdot R_C + g_{m2} \cdot R_F}}{1 + \frac{g_{m1} \cdot R_C \cdot R_F}{1 + g_{m1} \cdot R_C + g_{m2} \cdot R_F} \cdot g_{m2} \cdot A_1 \cdot B(s)} \text{ or} \quad (13)$$

$$\frac{V_{out}}{I_{in}} = -\frac{A}{1 + A \cdot \beta} \quad (14)$$

where $$A = \frac{g_{m1} \cdot R_C \cdot A_1 \cdot R_F}{1 + g_{m1} \cdot R_C + g_{m2} \cdot R_F}$$

(forward gain) and $\beta = g_{m2} \cdot B(s)$ (feedback gain).

At low optical power, where $R_C \cdot g_{m1} >> R_F \cdot g_{m2}$ or $R_F \cdot I_{PD} << R_C \cdot I_{C(Q1)}$, the transimpedance of the transimpedance amplifier transfer function can be simplified as:

$$\frac{V_{out}}{I_{in}} = \frac{R_F \cdot A_1}{1 + R_F \cdot A_1 \cdot g_{m2} \cdot B(s)} \quad (15)$$

In the signal frequency band, the transimpedance value becomes:

$$\frac{V_{out}}{I_{in}} = R_F \cdot A_1 \quad (16)$$

At high optical power, where $R_C \cdot g_{m1} << R_F \cdot g_{m2}$ or $R_F \cdot I_{PD} >> R_C \cdot I_{C(Q1)}$ $$\frac{V_{out}}{I_{in}} = \frac{\frac{g_{m1}}{g_{m2}} \cdot R_C \cdot A_1}{1 + \frac{g_{m1}}{g_{m2}} \cdot R_C \cdot A_1 \cdot g_{m2} \cdot B(s)} \quad (17)$$

In the signal frequency band, the transimpedance value becomes:

$$\frac{V_{out}}{I_{in}} = \frac{g_{m1}}{g_{m2}} \cdot R_C \cdot A_1 \text{ or} \quad (18)$$

$$\frac{V_{out}}{I_{in}} = \frac{I_{C(Q1)}}{I_{PD}} \cdot R_C \cdot A_1 \quad (19)$$

The low frequency feedback causes the closed loop gain frequency response to have a low frequency cutoff given by:

$$f_{HPF-3dB} = \frac{g_{m1} \cdot R_C \cdot A_1 \cdot R_F}{1 + g_{m1} \cdot R_C + g_{m2} \cdot R_F} \cdot g_{m2} \cdot B \cdot f_0 \quad (20)$$

where $$f_0 = \frac{w_0}{2\pi}$$

and B is the DC gain of the opamp.

At low optical power, $R_C \cdot g_{m1} >> R_F \cdot g_{m2}$ or $R_F \cdot I_{PD} << R_C \cdot I_{C(Q1)}$. Therefore, equation (20) can be simplified and the low frequency cutoff is given by:

$$f_{HPF-3dB} = R_F \cdot A_1 \cdot g_{m2} \cdot B \cdot f_0 \quad (21)$$

At high optical power, $R_C \cdot g_{m1} << R_F \cdot g_{m2}$ or $R_F \cdot I_{PD} >> R_C \cdot I_{C(Q1)}$. Therefore, equation (20) can be simplified and the low frequency cutoff is given by:

$$f_{HPF-3dB} = R_C \cdot A_1 \cdot g_{m1} \cdot B \cdot f_0 \quad (22)$$

Again, the low frequency cutoff at high optical power is not dependent on the transconductance of the transistor 502.

Figure 6:
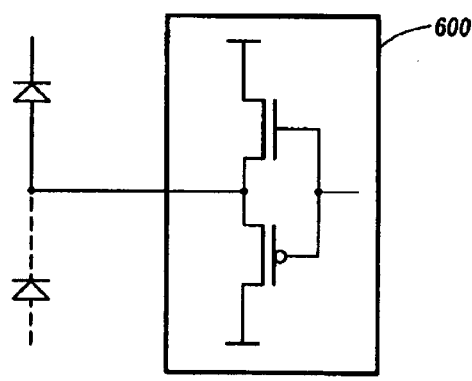
FIG. 6 illustrates another embodiment of feedback circuitry in a transimpedance amplifier using field effect transistors.

FIG. 6 illustrates an alternative embodiment of the variable impedance circuitry using field effect transistors instead of bipolar junction transistors. The variable impedance circuitry can include many types of field effect transistors (MOSFETS, JFETS), BJT transistors, and the like or any combination thereof. In another embodiment of the present invention, the photodiode that receives the optical signal is a photodiode that also amplifies the optical signal or other device that converts the optical signal into an electrical signal or current.

Figure 7:
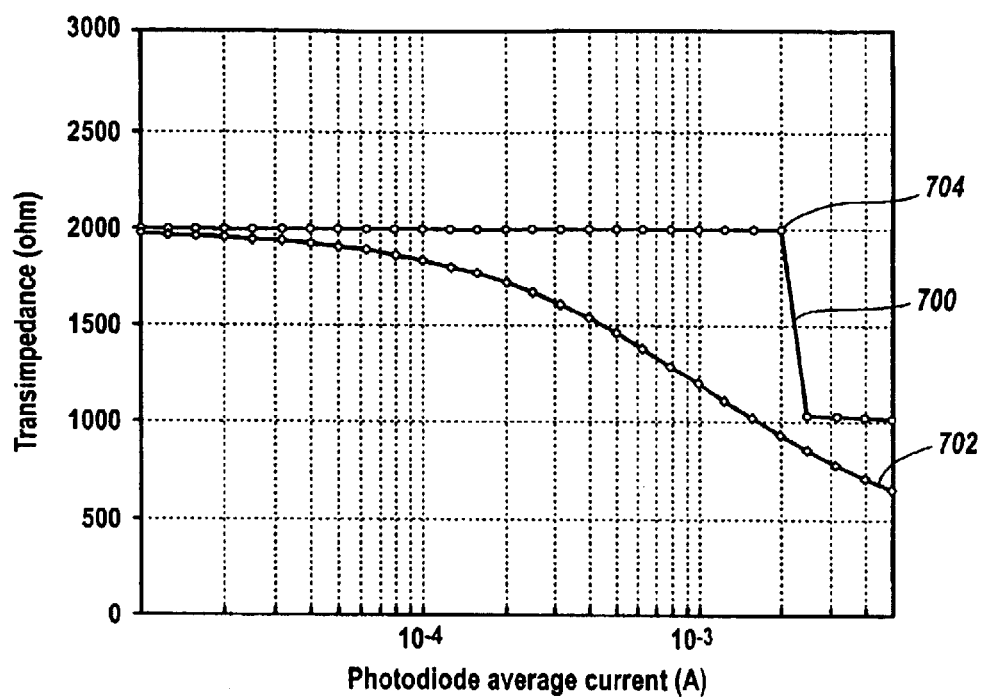
FIG. 7 plots the transimpedance of a transimpedance amplifier versus the average photodiode current.

FIG. 7 is a block diagram that plots the transimpedance of a transimpedance amplifier versus the average current of the photodiode. The plot 700 represents the transimpedance of an existing transimpedance amplifier that utilizes, in one embodiment, an npn transistor for automatic gain control and DC cancellation. For the plot 700, the collector of the npn transistor is typically connected with the input signal.

As the average photodiode current increases, the transimpedance of existing transimpedance amplifiers as illustrated by the plot 700 is relatively steady and does not drop until the current gets larger. The plot 702, on the other hand, illustrates that the transimpedance of the transimpedance amplifier illustrated in FIG. 3 decreases as the average photo diode current increases. The plot 702 also illustrates that the transimpedance increases as the average photo diode current decreases. At the point 704, for example, the transimpedance illustrated in the plot 700 is much higher than the transimpedance of the plot 702.

The variable impedance circuitry of the present invention, which includes a pnp transistor in one embodiment, enables the transimpedance amplifier to adjust to the average photodiode current gradually as the average photodiode current increases or decreases.

Figure 8:
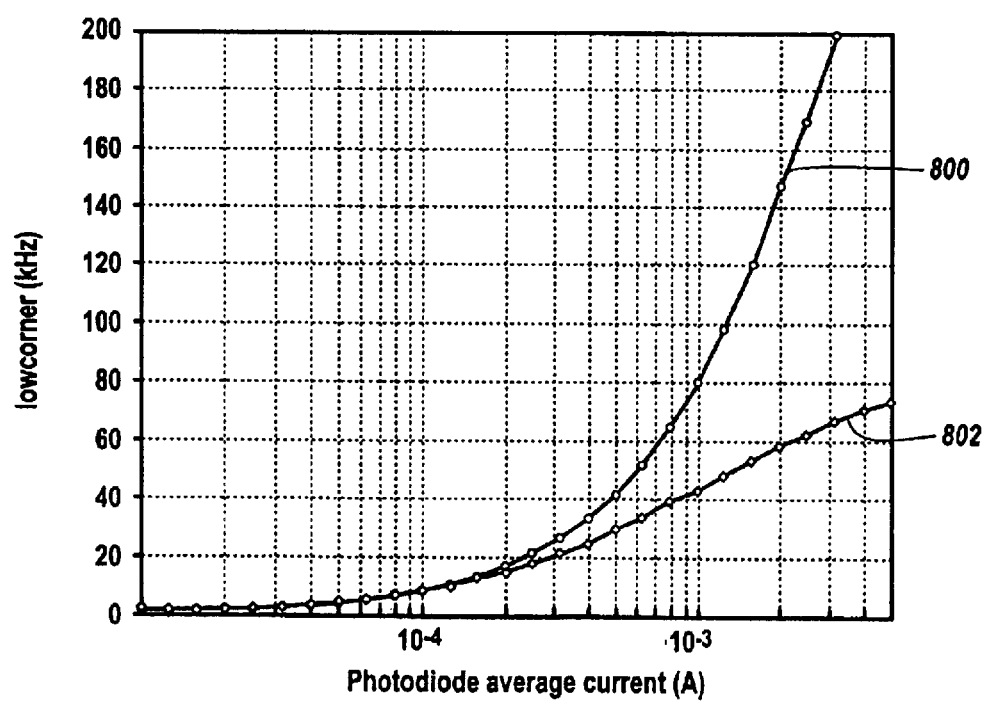
FIG. 8 plots the low cutoff frequency of a transimpedance amplifier versus the average current of the photodiode.
Figure 1:
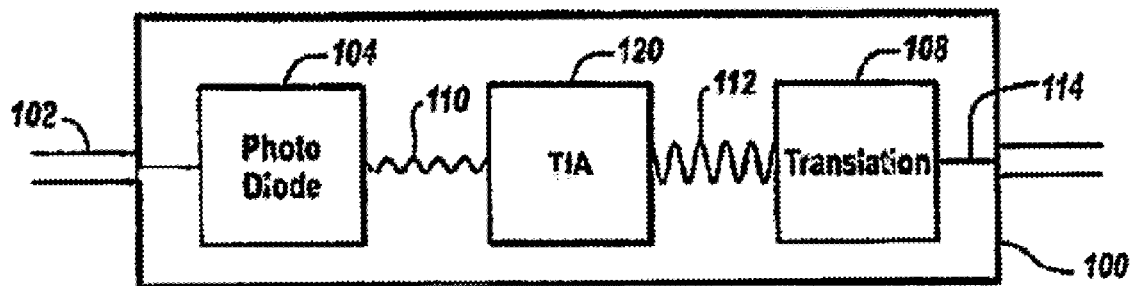
Figure 2:
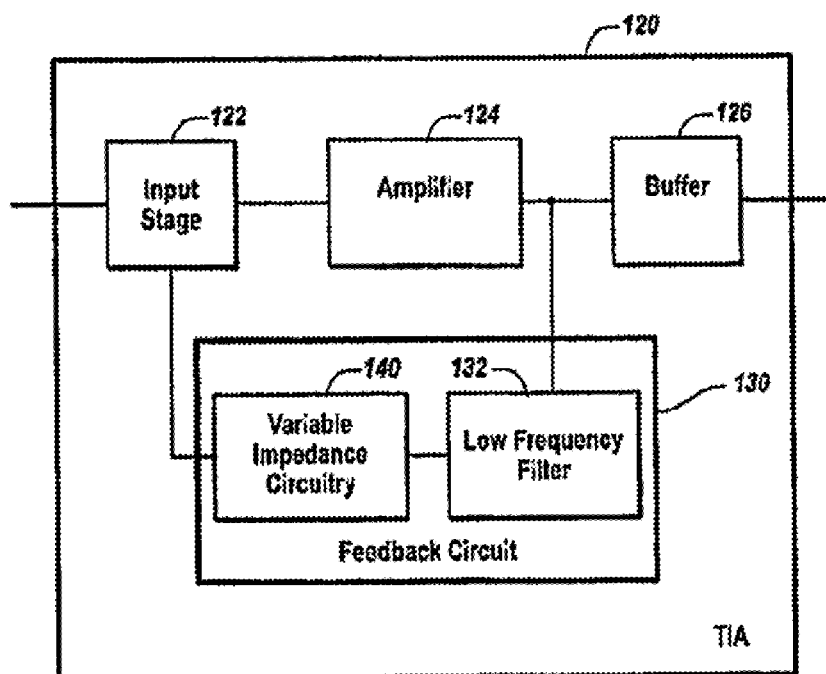
Figure 1:
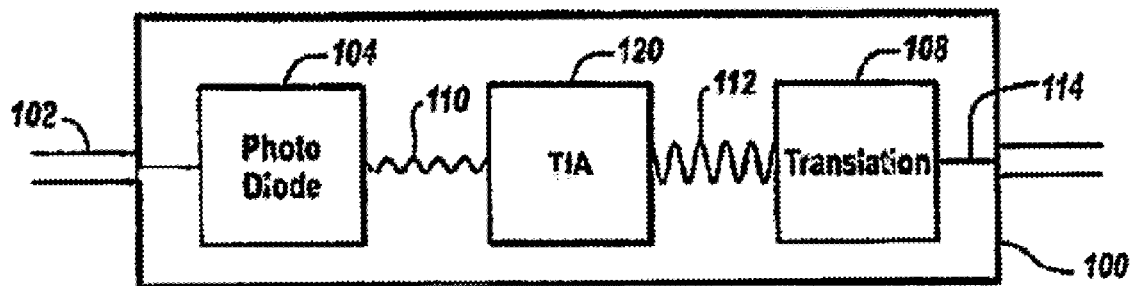
Figure 2:
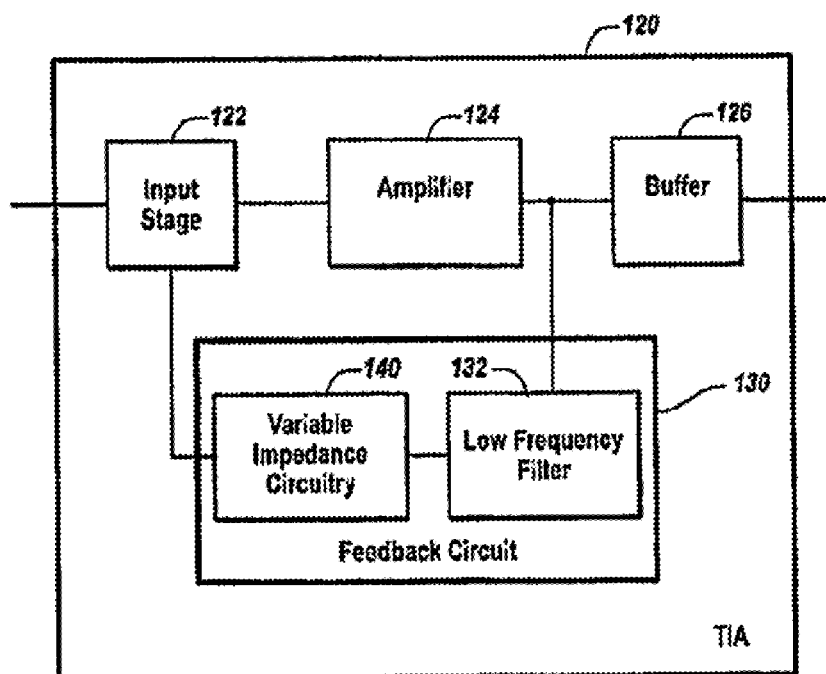

FIG. 8 is a graph that plots the low corner frequency of the transimpedance amplifier as it varies with the average photodiode current. The plot 800 illustrates a plot of the low corner frequency of existing transimpedance amplifiers. The plot 802 illustrates a plot of the low corner frequency of a transimpedance amplifier in accordance with the present invention. More particularly, the plot 802 represents the low corner frequency of the transimpedance amplifier illustrated in FIG. 3.

FIG. 8 illustrates that as the average photodiode current increases, the low cutoff frequency of the plot 800 increases rapidly and in some instances, exponentially. As previously described, this can ultimately result in circuit failure. In other words, the optical sensitivity of the transimpedance amplifier represented by the plot 800 is diminished because the low cutoff frequency is not controlled and increases quickly as the input power of the optical signal or of the current from the optical device that converts the optical signal to an input current increases.

In contrast, the low cutoff frequency of the transimpedance amplifier represented by the plot 802 levels off or approaches an upper limit as the average photodiode current increases. Because the increase in the low cutoff frequency in the plot 802 is substantially less than the increase illustrated by the plot 800, the transimpedance amplifier represented by the plot 802 can successfully amplify a wider range of input signals. The optical sensitivity is improved and the transimpedance amplifier can interact with legacy systems that may operate at lower frequencies. One of the reasons that the low cutoff frequency approaches an upper limit is because the transconductance of the variable impedance circuitry (the pnp transistor in one embodiment) is substantially independent of the average current at high input amplitudes or powers. This enables the variable impedance circuitry to shunt a DC component of the current, attenuate an AC component of the input current, and have a minimal increase in the low cutoff frequency of the transimpedance amplifier as the input current or signal increases.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic component, comprising:
   a detector configured to receive an optical signal; and
   a transimpedance amplifier having a controlled low cutoff frequency as optical power to the detector increases, and the transimpedance amplifier comprising:
      a forward transimpedance circuit configured to receive an input current from the detector; and
      a feedback circuit that includes:
         a first circuit configured to detect a low frequency component of the output signal; and
         a second circuit configured to be driven by the low frequency component of the output signal and connected with the forward transimpedance circuit such that a transconductance of the second circuit is substantially unrelated to a low frequency cutoff of the transimpedance amplifier as the input current increases.

2. The optoelectronic component as recited in claim 1, wherein the first circuit comprises a low frequency filter.

3. The optoelectronic component as recited in claim 1, wherein the second circuit has a variable impedance such that an increase in an optical overload associated with the transimpedance amplifier does not substantially diminish an optical sensitivity associated with the transimpedance amplifier.

4. The optoelectronic component as recited in claim 1, wherein the first circuit and the second current shunt a DC component of the input current such that a DC component of the output signal is substantially eliminated.

5. The optoelectronic component as recited in claim 1, wherein the detector comprises a photo diode.

6. The optoelectronic component as recited in claim 1, further comprising a translation module configured to:
   receive an amplified signal from the transimpedance amplifier; and
   generate a corresponding digital signal.

7. The optoelectronic component as recited in claim 1, wherein the second circuit further comprises one or more field effect transistors having an impedance that is dependent on an average current of the input electrical signal such that a low cutoff frequency of the transimpedance amplifier approaches an upper limit as the input current increases.

8. The optoelectronic component as recited in claim 1, wherein the second circuit further comprises an npn transistor, wherein an emitter of the npn transistor is connected with the forward transimpedance circuit and with the input current and wherein an impedance seen at the emitter of the npn transistor is dependent on an average current of the input current and a low cutoff frequency approaches an upper limit as the input current increases.

9. The optoelectronic component as recited in claim 1, wherein the second circuit further comprises a pnp transistor, wherein an emitter of the pnp transistor is connected with the forward transimpedance circuit and with the input current as an emitter follower such that the low cutoff frequency approaches an upper limit as the input current increases.

10. The optoelectronic component as recited in claim 9, wherein an impedance seen at the emitter of the pnp transistor is dependent on an average current of the input current and wherein the low cutoff frequency does not increase exponentially as the input current increases.

11. The optoelectronic component as recited in claim 1, wherein the second circuit further comprises an npn transistor and a pnp transistor, wherein an emitter of the npn transistor is connected with an emitter of the pnp transistor such that the second circuit can source or sink at least a portion of an AC component of the input current such that an AC portion of the input current is attenuated by the second circuit as the input current increases.

12. The optoelectronic component as recited in claim 1, wherein the transimpedance further comprises a buffer configured and arranged to receive a signal from the forward transimpedance circuit.

13. The optoelectronic component as recited in claim 1, wherein the optical signal received by the detector represents a data stream.

14. An optical receiver, comprising:
   a detector configured to receive an optical signal;
   a translation module; and
   a transimpedance amplifier configured for communication with the detector and the translation module and having a controlled low cutoff frequency as optical power to the detector increases, and the transimpedance amplifier comprising:
      an input stage that receives an input current signal from the detector and generates an output voltage;
      a gain stage that amplifies the output voltage to generate an amplified signal; and
      a feedback circuit that includes:
         a low frequency circuit that detects a low frequency component of the amplified signal such that the low frequency component can be substantially removed from the input current signal; and
         variable impedance circuitry, wherein an impedance of the variable impedance circuitry is dependent on an average current of the input current signal such that an AC portion of the input current signal is attenuated as the average current increases and wherein a low cutoff frequency of the transimpedance amplifier approaches an upper limit as the average current increases.

15. The optical receiver as recited in claim 14, wherein the input stage comprises a common base configuration and the gain stage comprises an amplifier.

16. The optical receiver as recited in claim 14, wherein the input stage comprises a shunt feedback configuration and the gain stage comprises an amplifier.

17. The optical receiver as recited in claim 14, wherein the low frequency circuit further comprises one of: a low frequency operational amplifier; or, a peak detector.

18. The optical receiver as recited in claim 14, wherein the low frequency circuit is configured to detect and reduce the low frequency component at the input stage by shunting the low frequency component of the input current signal.

19. The optical receiver as recited in claim 14, wherein the variable impedance circuitry further comprises a pnp transistor that has a transconductance that does not substantially affect the low cutoff frequency of the transimpedance amplifier as the input current signal increases.

20. The optical receiver as recited in claim 19, wherein the pnp transistor is driven by the low frequency circuit such that an impedance seen at an emitter of the pnp transistor decreases when an average current of the input current signal increases such that a portion of the input current signal is absorbed by the pnp transistor and an optical overload of the transimpedance amplifier is increased without causing the low cutoff frequency to rise exponentially as the input current signal increases.

21. The optical receiver as recited in claim 14, wherein the variable impedance circuitry further comprises an npn transistor driven by the low frequency circuit such that an impedance seen at an emitter of the npn transistor decreases when an average current of the input current signal increases such that a portion of the input current signal is absorbed by the npn transistor and an optical overload associated with the transimpedance amplifier is increased.

22. The optical receiver as recited in claim 21, wherein the impedance seen at the emitter of the npn transistor increases when the average current of the input current signal decreases such that an optical sensitivity of the transimpedance amplifier is not substantially reduced at an upper limit of the low cutoff frequency.

23. The optical receiver as recited in claim 14, wherein the detector comprises a photodiode.

24. The optical receiver as recited in claim 14, wherein the variable impedance circuitry further comprises an emitter of a pnp transistor coupled with an emitter of an npn transistor such that a DC component of the input current signal can be sunk or sourced and at least a portion of an AC component of the input current signal can be attenuated, wherein a low cutoff frequency is substantially unrelated to a transconductance of either the npn transistor or the pnp transistor as the input current increases.

25. The optical receiver as recited in claim 14, wherein the variable impedance circuitry further comprises at least one field effect transistor having an impedance that is dependent on an average current of the input current signal such that a low cutoff frequency of the transimpedance amplifier approaches an upper limit as the input current increases.

26. In an optoelectronic component that receives optical signals of different optical powers, a method for controlling a low cutoff frequency as optical power of an optical signal changes, the method comprising:

converting an optical signal to an input current;

amplifying the input current to produce an output signal;

detecting a low frequency component of the output signal, wherein the low frequency component corresponds to an impedance level of a variable impedance associated with the input current; and attenuating an AC component of the input current with the variable impedance by reducing an impedance level of the variable impedance as the input current increases in amplitude, wherein a low cutoff frequency is substantially independent of the transconductance of the variable impedance and wherein the low cutoff frequency approaches an upper limit as the amplitude of the input current increases.

27. The method as recited in claim 26, further comprising converting the received input current to a voltage signal so that the output signal comprises an amplified voltage signal.

28. The method as recited in claim 26, wherein detecting a low frequency component of the output signal comprises detecting a DC component of the output signal.

29. The method as recited in claim 26, wherein attenuating an AC component with the variable impedance by reducing an impedance of the variable impedance as the input current increases in amplitude includes shunting a DC component of the input current to ground so as to substantially cancel the low frequency component of the output signal.

30. The method as recited in claim 26, further comprising shunting a DC component of the input current and attenuating an AC component of the input current such that the low cutoff frequency is substantially unaffected as the power of the input current increases.

31. The method as recited in claim 30, wherein attenuating an AC component of the input current, such that the low cutoff frequency is substantially unaffected as the power of the input current increases, comprises automatic gain control.

32. The method as recited in claim 26, further comprising substantially preventing a low cutoff frequency of the transimpedance amplifier from increasing exponentially as the input current increases.

33. The method as recited in claim 26, wherein the optical signal represents a data stream.

* * * * *

UNITED STATES PATENT AND TRADEMARK OFFICE
CERTIFICATE OF CORRECTION

PATENT NO. : 7,030,702 B2
APPLICATION NO. : 10/838019
DATED : April 18, 2006
INVENTOR(S) : Denoyer et al.

It is certified that error appears in the above-identified patent and that said Letters Patent is hereby corrected as shown below:

Title Page
Abstract Clause, line 3, change "translationl" to --translation--

Drawings
Sheet 1, change Fig. 1 to the figure depicted herein below, wherein the digital signal has been labeled --114-- as shown in attached sheet 1 of 4.

Column 5
Line 43, before "FIG. 3", insert --in--
Line 44, before "npn", change "a" to --an--

Column 9
Line 55, Equation 21, change "$f_{HPF\text{-}3dB} = R_C \cdot A_1 = g_{m2} \cdot f_0$" to
--$f_{HPF\text{-}3dB} = R_C \cdot A_1 \cdot g_{m2} \cdot f_0$ --

Signed and Sealed this

Seventh Day of August, 2007

JON W. DUDAS
*Director of the United States Patent and Trademark Office*

UNITED STATES PATENT AND TRADEMARK OFFICE
CERTIFICATE OF CORRECTION

PATENT NO. : 7,030,702 B2
APPLICATION NO. : 10/838019
DATED : April 18, 2006
INVENTOR(S) : Denoyer et al.

It is certified that error appears in the above-identified patent and that said Letters Patent is hereby corrected as shown below:

Title Page
Abstract Clause, line 3, change "translationl" to --translation--

Drawings
Sheet 1, change Fig. 1 to the figure depicted herein below, wherein the digital signal has been labeled --114-- as shown in attached sheet 1 of 4.

Column 5
Line 43, before "FIG. 3", insert --in--
Line 44, before "npn", change "a" to --an--

Column 9
Line 55, Equation 21, change "$f_{HPF-3dB} = R_C \cdot A_1 = g_{m2} \cdot f_0$" to
--$f_{HPF-3dB} = R_C \cdot A_1 \cdot g_{m2} \cdot f_0$ --

This certificate supersedes Certificate of Correction issued August 7, 2007.

Signed and Sealed this

Twenty-eighth Day of August, 2007

JON W. DUDAS
*Director of the United States Patent and Trademark Office*